(12) United States Patent
Yanagigawa et al.

(10) Patent No.: US 7,400,163 B2
(45) Date of Patent: Jul. 15, 2008

(54) DEAD TIME CONTROL CIRCUIT CAPABLE OF ADJUSTING TEMPERATURE CHARACTERISTICS OF DEAD TIME

(75) Inventors: Hiroshi Yanagigawa, Shiga (JP); Mitsuru Yoshida, Shiga (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 95 days.

(21) Appl. No.: 11/455,198

(22) Filed: Jun. 19, 2006

(65) Prior Publication Data

US 2006/0290401 A1     Dec. 28, 2006

(30) Foreign Application Priority Data

Jun. 20, 2005     (JP)     ............................. 2005-179012

(51) Int. Cl.
*H03K 17/14*     (2006.01)
*H03K 17/284*     (2006.01)

(52) U.S. Cl. .......................... 326/26; 326/82; 327/261; 323/282

(58) Field of Classification Search .................. 326/26, 326/27, 82, 83; 327/261; 323/282; 330/10, 330/207 A; 363/13
See application file for complete search history.

(56) References Cited

U.S. PATENT DOCUMENTS

2006/0164867 A1* 7/2006 Dikken et al. .................. 363/13

FOREIGN PATENT DOCUMENTS

| JP | 6-216750 | | 8/1994 |
| JP | 2006352741 A | * | 12/2006 |

* cited by examiner

*Primary Examiner*—Daniel D Chang
(74) *Attorney, Agent, or Firm*—McGinn IP Law Group, PLLC

(57) ABSTRACT

In a dead time control circuit, a delay circuit is connected to an input terminal and adapted to delay signals therethrough by a delay time corresponding to a dead time. A logic circuit has a first input connected via the delay circuit to the input terminal, a second input connected directly to the input terminal, and an output connected to an output terminal. The dead time having adjustable temperature characteristics.

12 Claims, 16 Drawing Sheets

Fig. 9

| r2 | Vref | D |
|---|---|---|
| LARGE | POSITIVE TEMP. COEFFICIENT | NEGATIVE TEMP. COEFFICIENT |
| SMALL | NEGATIVE TEMP. COEFFICIENT | POSITIVE TEMP. COEFFICIENT |

DEAD TIME CONTROL CIRCUIT CAPABLE OF ADJUSTING TEMPERATURE CHARACTERISTICS OF DEAD TIME

BACKGROUND OF THE INVENTION

1. Field of the Invention

The present invention relates to a dead time control circuit used in a predriver for driving a half bridge circuit or a push-pull type output buffer for driving a load.

2. Description of the Related Art

In a push-pull type output buffer, two switching elements are connected between a power supply terminal and a ground terminal. When the switching elements are alternately turned ON and OFF to drive a load connected thereto, if the switching elements are simultaneously turned ON, a large penetration current flows through the push-pull type output buffer, so that the switching elements would be broken down.

In order to avoid such a large penetration current, a simultaneous-OFF time or a dead time is introduced between the ON times of the switching elements. Generally, two dead time control circuits each corresponding to one of the switching elements are provided.

A first prior art dead time control circuit is constructed by a delay circuit formed by two inverters connected in series for delaying an input signal and an AND circuit for receiving the input signal via the delay circuit and directly. This will be explained later in detail.

In the above-described first prior art dead time control circuit, however, even when the delay time of the delay circuit fluctuates due to environmental factors such as temperature, power supply voltage, etc., it is impossible to adjust the delay time, i.e., the dead time.

A second prior art dead time control circuit further includes a delay circuit formed by an external resistor and an external capacitor between the inverters of the first prior art dead time control circuit. Therefore, when the delay time fluctuates due to environmental factors, the delay time can be adjusted by the external resistor and the external capacitor. This also will be explained later in detail.

The above-described second prior art dead time control circuit, however, is increased in size and manufacturing cost due to the external resistor and the external capacitor. Also, since the characteristics of the external resistor and the external capacitor per se fluctuate, it is impossible to accurately control the dead time.

A third prior art dead time control circuit further includes two constant current sources connected to one of the inverters of the first prior art dead time control circuit, the constant current source including analogous circuit elements as in the other of the inverters. As a result, the response speed characteristic of one of the inverters is opposite to that of the other, so that the entire delay time of the dead time control circuit becomes stable. This also will be explained later in detail.

SUMMARY OF THE INVENTION

In the above-described third prior art dead time control circuit, however, since the rising/falling characteristics of the output voltage have a positive temperature coefficient while the dead time determined by the two dead time control circuits has a negative temperature coefficient, a large penetration current would flow through the switching elements when the temperature is high.

According to -the present invention, in a dead time control circuit, a delay circuit is connected to an input terminal and adapted to delay signals therethrough by a delay time corresponding to a dead time. A logic circuit has a first input connected via the delay circuit to the input terminal, a second input connected directly to the input terminal, and an output connected to an output terminal. The dead time having adjustable temperature characteristics.

BRIEF DESCRIPTION OF THE DRAWINGS

The present invention will be more clearly understood from the description set forth below, as compared with the prior art, with reference to the accompanying drawings, wherein:

FIG. 9 is a table for showing the operating characteristics of the dead time control circuits of FIG. 7;

DESCRIPTION OF THE PREFERRED EMBODIMENTS

Before the description of the preferred embodiments, prior art dead time control circuits will be explained with reference to FIGS. 1, 2, 3, 4, 5 and 6.

Figure 1:
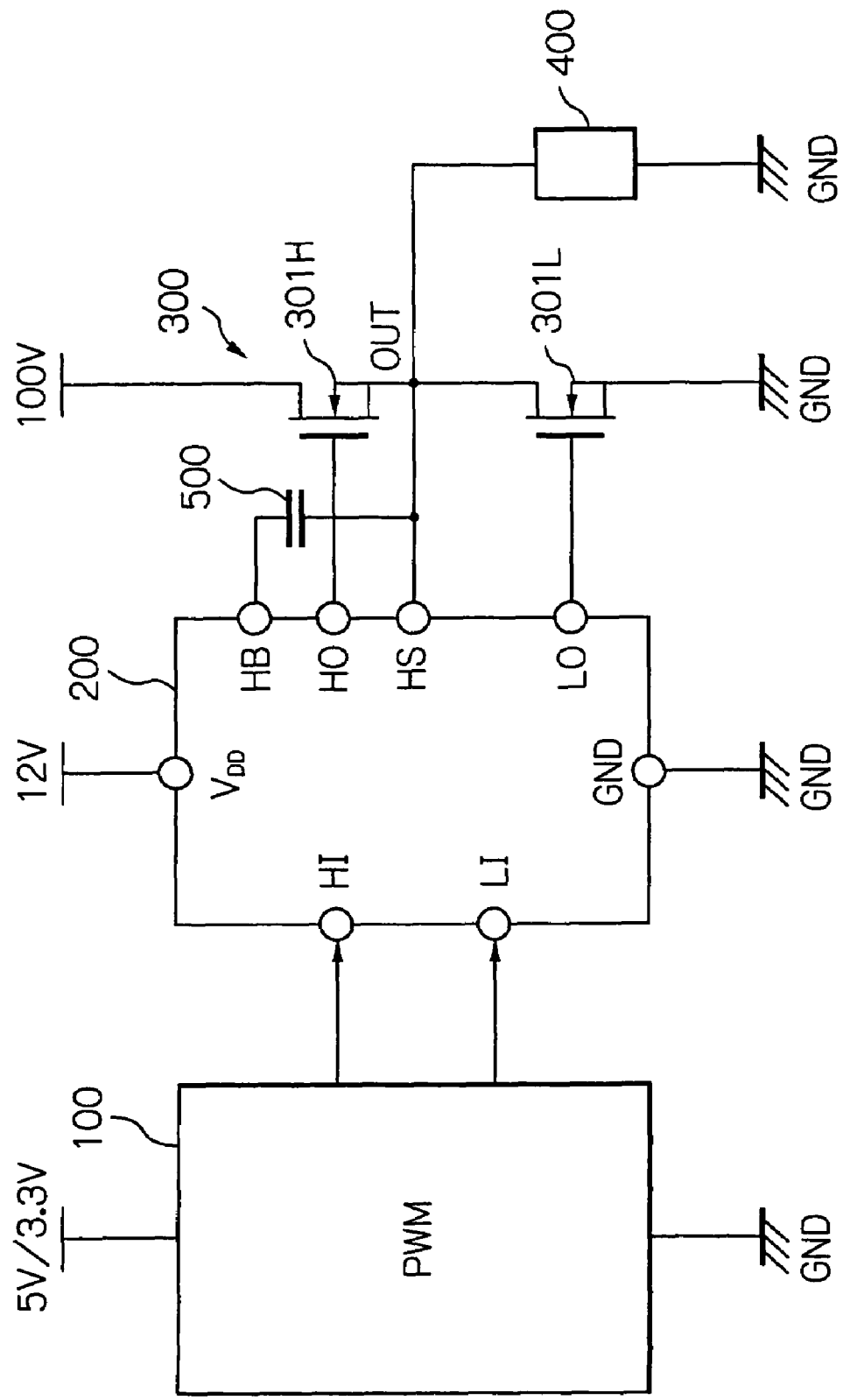
FIG. 1 is a circuit diagram illustrating a prior art digital audio apparatus.

In FIG. 1, which illustrates a prior art digital audio apparatus, a pulse width modulator 100 powered by a relatively low power supply voltage such as 5V or 3V generates output voltages and transmits them to a high-side input terminal HI and a low-side input terminal LI of a predriver 200 powered by a relatively high power supply voltage such as 12V at its power supply terminal $V_{DD}$. The predriver 200 generates output voltages at their high-side output terminal HO and low-side output terminal LO and transmits them to a half bridge circuit or a push-pull type output buffer 300 powered by a commercial power supply voltage such as 100V.

The push-pull type output buffer 300 receives the output voltages at the high-side output terminal HO and the low-side output terminal LO of the predriver 200 to generate an output voltage OUT, thus driving a load 400.

The push-pull type output buffer 300 is constructed by two-enhancement-type N-channel MOS transistors 301H and 301L as switching elements connected in series between the power supply voltage terminal (100V) and the ground terminal GND.

The common node between the MOS transistors 301H and 301L is connected to a high-side source terminal HS of the predriver 200 and the load 400, and also is connected via a bootstrap capacitor 500 to a high-side bias terminal HB of the predriver 200. Due to the presence of the bootstrap capacitor 500, when the output voltage OUT is high, the voltage at the high-side source terminal HS is 100V and the voltage at the high-side bias terminal HB is 112V (=100V+12V), and, when the output voltage OUT is low, the voltage at the high-side source terminal HS is 0V and the voltage at the high-side bias terminal HB is 114V (=12V+$V_F$) where $V_F$ is a forward voltage of the MOS transistor 301L. That is, even when the MOS transistors 301H and 301L are turned ON and OFF, the voltage between the terminals of the bootstrap capacitor 500 can be maintained at 12V. In the push-pull type output circuit 300, the MOS transistors 301H and 301L are alternately turned ON and OFF to drive the load 400; in this case, if the MOS transistors 301H and 301L are simultaneously turned ON, a large penetration current flows through the MOS transistors 301H and 301L, so that the MOS transistors 301H and 301L would be broken down. In order to avoid such a large penetration current, a simultaneous-OFF time or a dead time is introduced between the ON time of the MOS transistor 301H and the ON time of the MOS transistor 301L. That is, during such a dead time, the MOS transistors 301H and 301L are both turned OFF. For example, a rising timing of the voltage at one of the output terminals HO and LO is delayed as compared with a falling timing of the voltage at the other of the output terminals HO and LO.

Figure 2:
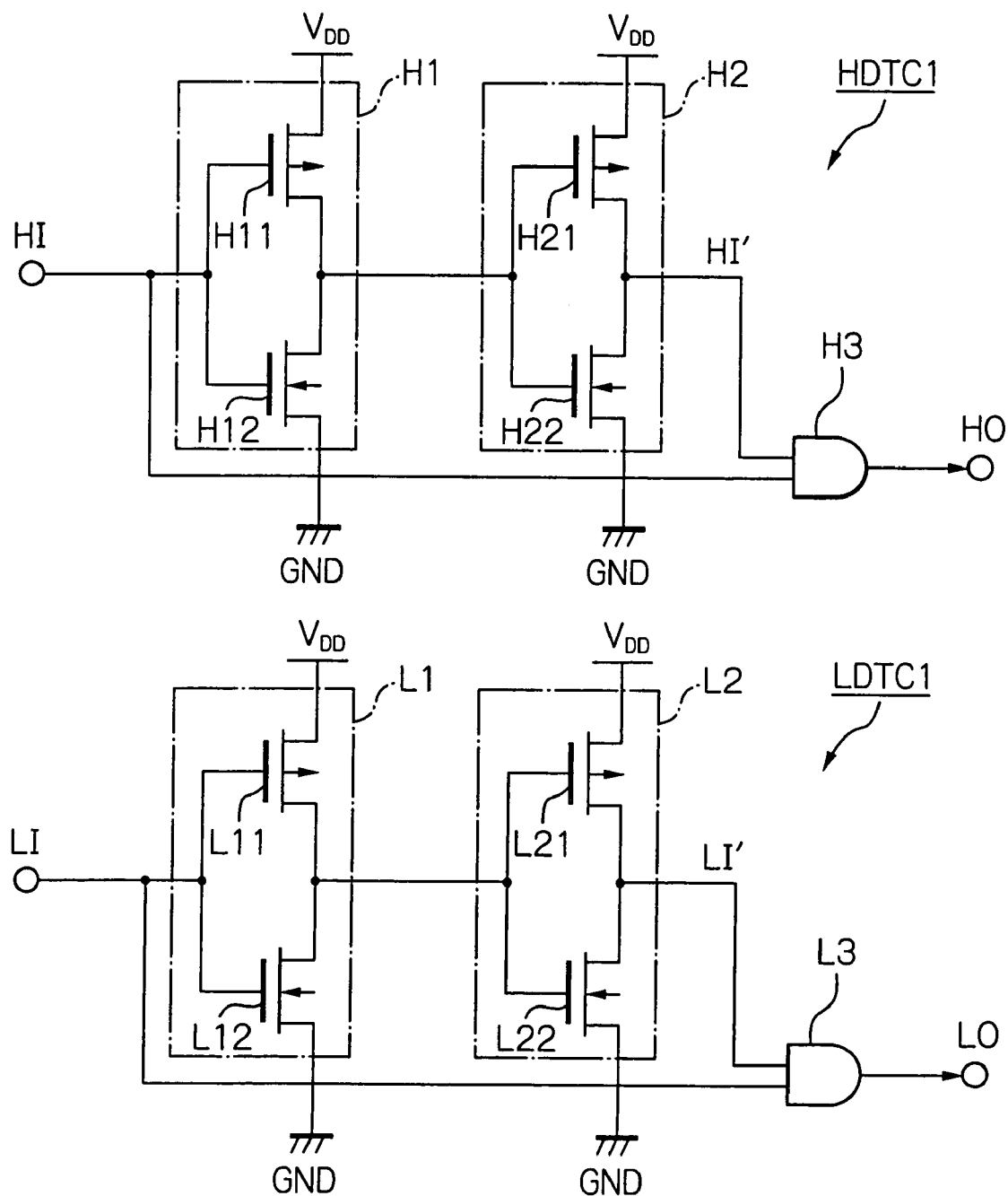
FIG. 2 is a circuit diagram illustrating a high-side dead time control circuit and a low-side dead time control circuit each as a first prior art dead time control circuit.

In order to provide a dead time, a high-side dead time control circuit HDTC1 and a low-side dead time control circuit LDTC1 as illustrated in FIG. 2 are included in the predriver 200 of FIG. 1.

In FIG. 2, the high-side dead time control circuit HDTC1 is constructed by a delay circuit formed by CMOS inverters H1 and H2 connected in series and an AND circuit H3 having a first input connected via the delay circuit (H1, H2) to the high-side input terminal H1, a second input connected directly to the high-side input terminal HI and an output connected to the high-side output terminal HO. Similarly, the low-side dead time control circuit LDTC1 is constructed by a delay circuit formed by CMOS inverters L1 and L2 connected in series and an AND circuit L3 having a first input connected via the delay circuit (L1, L2) to the low-side input terminal LI, a second input connected directly to the low-side input terminal LI and an output connected to the low-side output terminal LO. That is, the high-side dead time control circuit HDTC1 has the same structure as the low-side dead time control circuit LDTC1.

The CMOS inverter H1 (H2, L1 or L2) is constructed by a p-channel MOS transistor H11 (H21, L11 or L21) and an n-channel MOS transistor H12 (H22, L12 or L22) connected in series between the power supply terminal $V_{DD}$ and the ground terminal GND.

Figure 3:
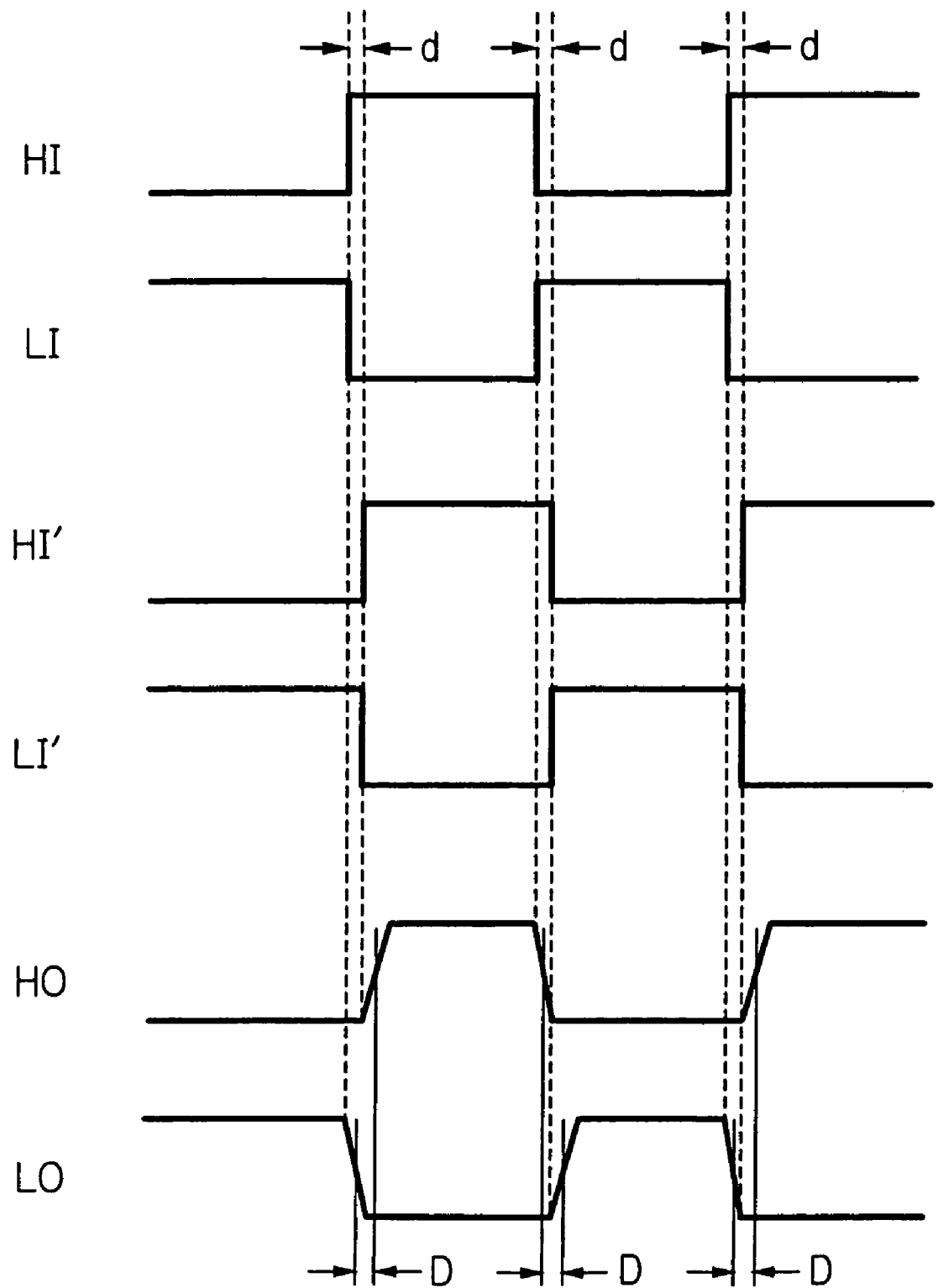
FIG. 3 is a timing diagram for explaining the operation of the high-side dead time control circuit and the low-side dead time control circuit of FIG. 2.

The operation of the dead time control circuits HDTC1 and LDTC1 is explained next with reference to FIG. 3. Here, assume that a delay time of each of the delay circuits is defined by "d".

That is, a rising edge and a falling edge of the voltages at the input terminals HI and LI are both delayed by the delay time "d" to obtain voltages HI' and LI' which are supplied to first inputs of the AND circuits H3 and L3, respectively. On the other hand, the voltages at the input terminals HI and LI are supplied directly to the second inputs of the AND circuits H3 and L3, respectively. As a result, the AND circuits H3 and L3 delay only the rising edges of the voltages at the input terminals HI and LI to generate voltages at the output terminals HO and LO as shown in FIG. 3. Thus, a dead time D corresponding to the delay time "d" is generated between the voltages at the output terminals HO and LO.

In the dead time control circuits HDTC1 and LDTC1 of FIG. 2, however, even when the delay time of each of the CMOS inverters H1, H2, L1 and L2 fluctuate due to the environmental factors such as the temperature, the power supply voltage, etc. to change the dead time D, it is impossible to adjust the dead time D.

Figure 4:
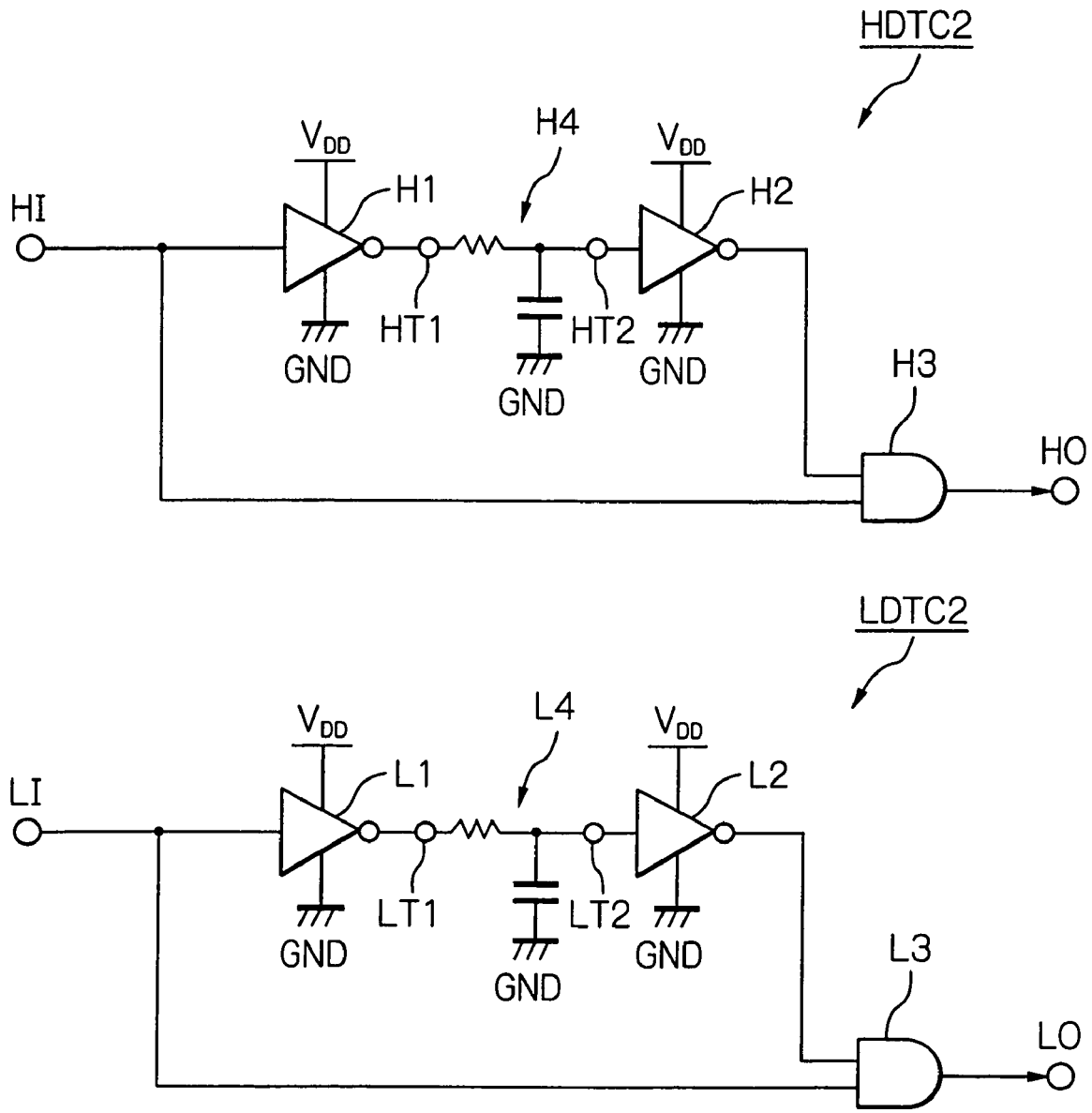
FIG. 4 is a circuit diagram illustrating a high-side dead time control circuit and a low-side dead time control circuit each as a second prior art dead time control circuit.

In FIG. 4, which illustrates a high-side dead time control circuit HDTC2 and a low-side dead time control circuit LDTC2 each as a second prior art dead time control circuit, a delay circuit H4 formed by an external resistor and an external capacitor is connected between the inverters H1 and H2 by external terminals HT1 and HT2, and, a delay circuit L4 formed by an external resistor and an external capacitor is connected between the inverters L1 and L2 by external terminals LT1 and LT2. Thus, the dead time D can be easily adjusted by changing time constants using the external resistors and the external capacitors of the delay circuits H4 and L4. Note that the resistors of the delay circuits H4 and L4 can be internal elements; in this case, the time constants are changed by only the external capacitors.

In the dead time control circuits HDTC2 and HDTC2 of FIG. 4, however, since the delay circuits H4 and L4 formed by the external resistors and the external capacitors are provided, the dead time control circuits HDTC2 and LDTC2 are substantially increased in size and manufacturing cost. Also, since the characteristics of the external resistors and the external capacitors of the delay circuits H4 and L4 per se greatly fluctuate, it is impossible to accurately adjust the dead time D. Particularly, it is impossible to accurately adjust the dead time D in a high speed digital amplifier where accuracy of the dead time D is required on the nanosecond order.

Figure 5:
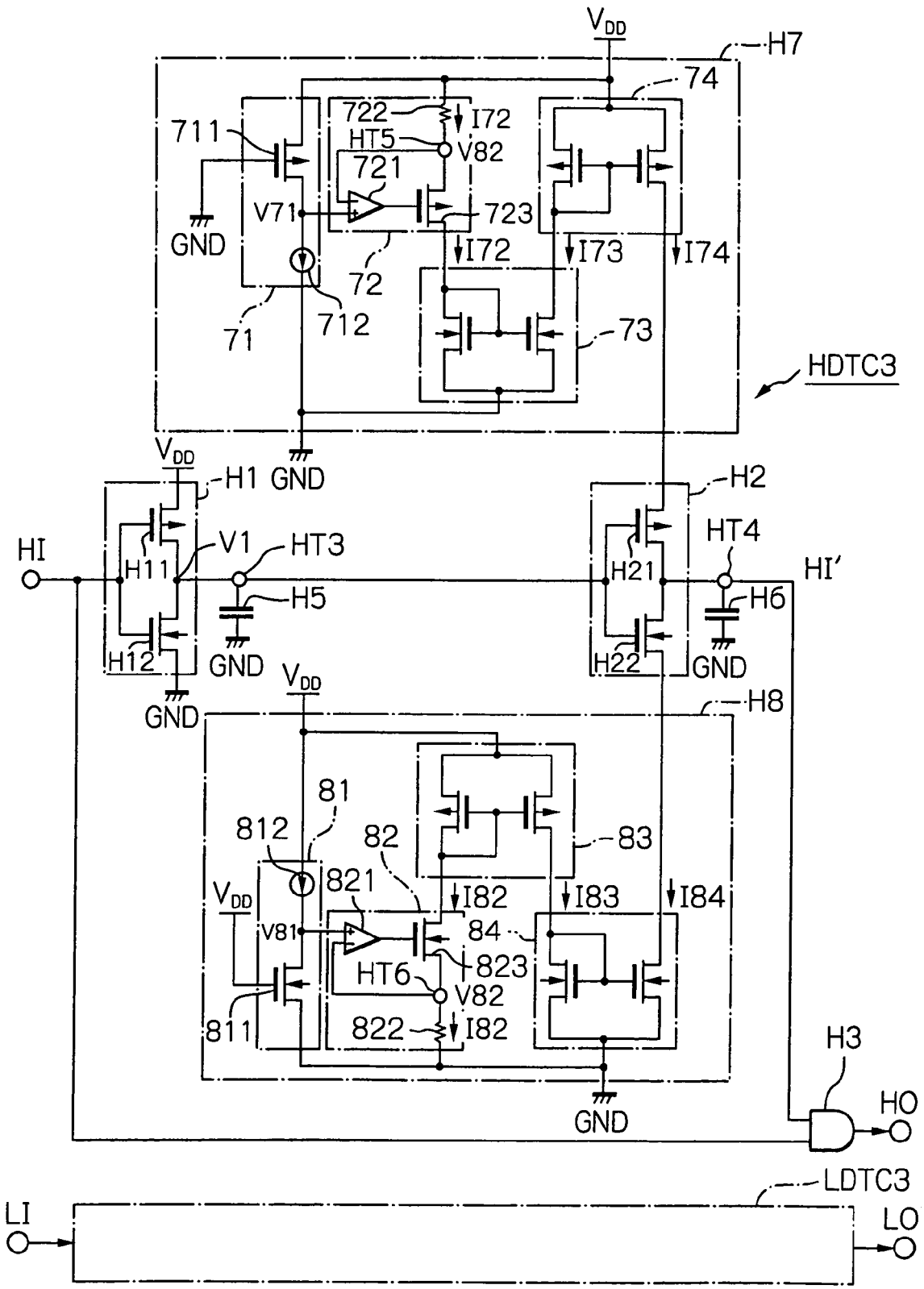
FIG. 5 is a circuit diagram illustrating a high-side dead time control circuit and a low-side dead time control circuit each as a third prior art dead time control circuit.

In FIG. 5, which illustrates a high-side dead time control circuit HDTC3 and a low-side dead time control circuit LDTC3 each as a third prior art dead time control circuit (see: JP-6-216750-A), since the low-side dead time control circuit LDTC3 has all the same structure as the high-side dead time control circuit HDTC3, only the high-side dead time control circuit HDTC3 is illustrated in detail. Note that the high-side dead time control circuit HDTC3 is realized by combining the circuits of FIGS. 2, 3, 5, 6 and 7 of JP-6-216750-A.

In the high-side dead time control circuit HDTC3 of FIG. 5, an external capacitor H5 is connected via an external terminal HT3 to the output of the CMOS inverter H1 of FIG. 2, and an external capacitor H6 is connected via an external terminal HT4 to the output of the CMOS inverter H2 of FIG. 2.

Also, in the high-side dead time control circuit HDTC3 of FIG. 5, a constant current source H7 is connected between the power supply terminal $V_{DD}$ and the source of the p-channel MOS transistor H21 of the CMOS inverter H2 of FIG. 2, and a constant current source H8 is connected between the source of the n-channel MOS transistor H22 of the CMOS inverter H2 and the ground terminal GND of FIG. 2.

In the constant current source H7, an analogous voltage generating circuit 71 formed by a p-channel MOS transistor 711 analogous to the p-channel MOS transistor H11 of the CMOS inverter H1 and a current source 712 is provided, so that a voltage V71 between the p-channel MOS transistor 711 and the current source 712 is analogous to the output voltage V1 of the CMOS inverter H1. The voltage V71 is converted by a voltage-to-current converter 72 into a current I72. That is, the voltage V71 is followed by a voltage V72 at an external terminal HT5 through an operational amplifier 721, so that the current I72 flows through an external resistor 722 and a p-channel MOS transistor 723. The current I72 is supplied as an input current to a current mirror circuit 73 which generates an output current I73. The output current I73 is supplied as an input current to a current mirror circuit 74 which generates an output current I74 which is supplied to the source of the p-channel MOS transistor H21 of the CMOS inverter H2. In this case, if the transistors of the current mirror circuit 73 have the same size ratio W/L (W: gate width, L: gate length) as each other and the transistors of the current mirror circuit 74 have the same ratio W/L as each other, $$I72=I73=I74.$$

If the p-channel MOS transistor H11 of the CMOS inverter H1, i.e., the p-channel MOS transistor 711, has a rapid response speed, the current I74 becomes small to decrease the response speed of the p-channel MOS transistor H21 of the CMOS inverter H2. On the other hand, if the p-channel MOS transistor H11 of the CMOS inverter H1, i.e., the p-channel MOS transistor 711, has a slow response speed, the current I74 becomes large to increase the response speed of the p-channel MOS transistor H21 of the CMOS inverter H2. Thus, the response speed characteristic of the p-channel MOS transistor H11 of the CMOS inverter H1 is opposite to the response speed characteristic of the p-channel MOS transistor H21 of the CMOS inverter H2.

Similarly, in the constant current source H8, an analogous voltage generating circuit 81 formed by an n-channel MOS transistor 811 analogous to the n-channel MOS transistor H12 of the CMOS inverter H1 and a current source 812 is provided, so that a voltage V81 between the n-channel MOS transistor 811 and the current source 812 is analogous to the output voltage V1 of the CMOS inverter H1. The voltage V81 is converted by a voltage-to-current converter 82 into a current I82. That is, the voltage V82 is followed by a voltage V82 at an external terminal HT6 through an operational amplifier 821, so that the current I82 flows through an external resistor 822 and an n-channel MOS transistor 823. The current I82 is supplied as an input current to a current mirror circuit 83 which generates an output current I83. The output current I83 is supplied as an input current to a current mirror circuit 84 which generates an output current I84 which is supplied to the source of the n-channel MOS transistor H22 of the CMOS inverter H2. In this case, if the transistors of the current mirror circuit 83 have the same size ratio W/L as each other and the transistors of the current mirror circuit 84 have the same ratio W/L as each other, $$I82=I83=I84.$$

If the n-channel MOS transistor H12 of the CMOS inverter H1, i.e., the n-channel MOS transistor 811, has a rapid response speed, the current I84 becomes small to decrease the response speed of the n-channel MOS transistor H22 of the CMOS inverter H2. On the other hand, if the n-channel MOS transistor H12 of the CMOS inverter H1, i.e., the n-channel MOS transistor 811, has a slow response speed, the current I84 becomes large to increase the response speed of the n-channel MOS transistor H22 of the CMOS inverter H2. Thus, the response speed characteristic of the n-channel MOS transistor H12 of the CMOS inverter H1 is opposite to the response speed characteristic of the n-channel MOS transistor H22 of the CMOS inverter H2.

Therefore, in FIG. 5, when the delay time CMOS inverter H1 decreases due to environmental factors such as temperature, power supply voltage, etc., the delay time of the CMOS inverter H2 increases. As a result, the delay time of the entire delay circuit formed by the CMOS inverters H1 and H2 becomes stable.

In FIG. 5, note that the delay time of the entire delay circuit can be adjusted by the external capacitors H5 and H6 and the external resistors 74 and 84.

Figure 6:
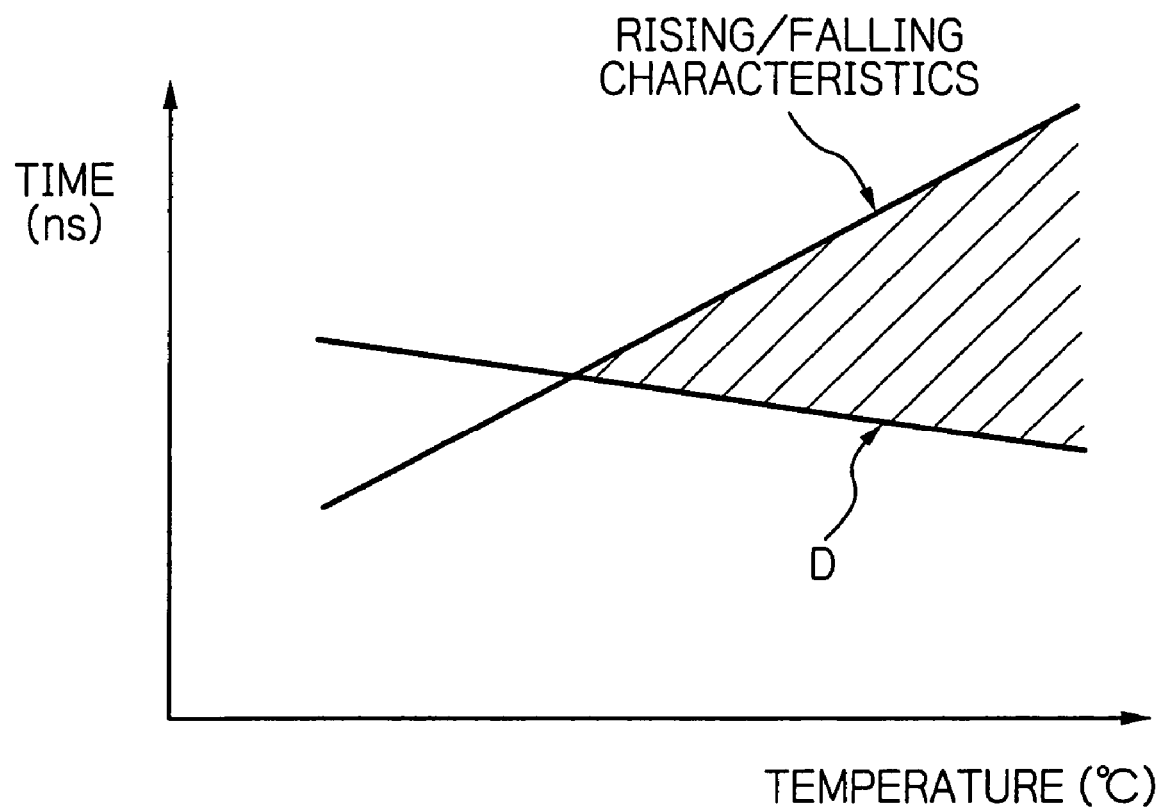
FIG. 6 is a graph for showing the operating characteristics of the dead time control circuit of FIG. 5.

In the dead time control circuits HDTC3 and LDTC3 of FIG. 5, however, as shown in FIG. 6, the rising/falling characteristics of the voltages at the high-side output terminal HO and the low-side output terminal LO have a positive temperature coefficient, while the dead time D has a negative temperature coefficient. As a result, as indicated by a hatched portion in FIG. 6, when the temperature is high, the dead time D is small while the output voltages at the high-side output terminal HO and the low-side output terminal LO are both high, so that a large penetration current would flow through the MOS transistors 301H and 301L of FIG. 1. Also, since the external capacitors H5 and H6 are provided, the dead time control circuits HDTC3 and LDTC3 are substantially increased in size and manufacturing cost.

Figure 7:
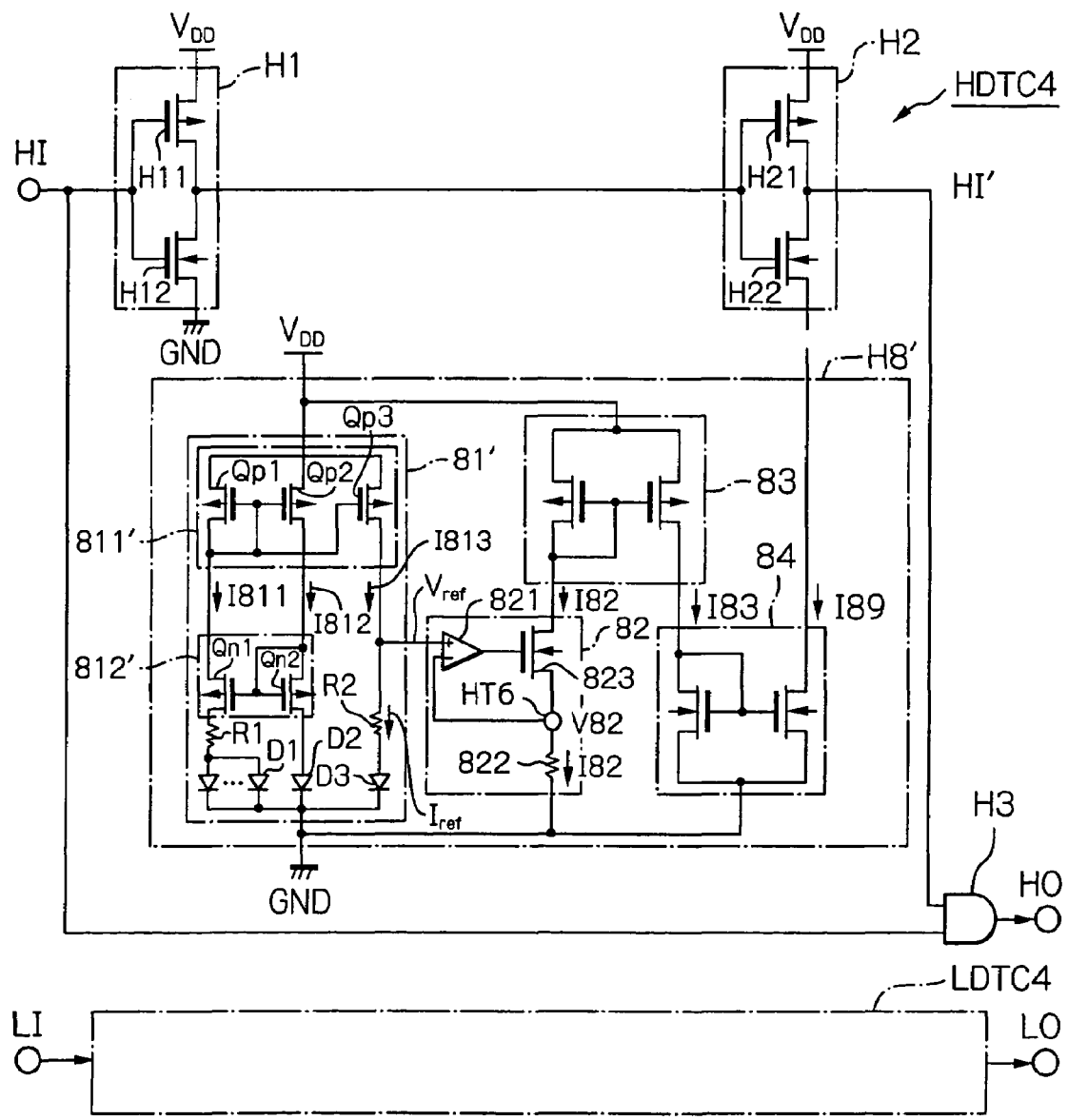
FIG. 7 is a circuit diagram illustrating a high-side dead time control circuit and a low-side dead time control circuit each as a first embodiment of the dead time control circuit according to the present invention.

In FIG. 7, which illustrates a high-side dead time control circuit HDTC4 and a low-side dead time control circuit LDTC4 each as a first embodiment of the present invention, only the high-side dead time control circuit HDTC4 is illustrated in detail, since the low-side dead time control circuit LDTC4 has all the same structure as the high-side dead time control circuit HDTC4.

In FIG. 7, the external capacitor H5 connected to the external terminal HT3, the external capacitor H6 connected to the external terminal HT4 and the constant current source H7 of FIG. 5 are deleted to decrease the size and manufacturing cost. Also, the constant current source H8 of FIG. 5 is modified to a constant current source H8' where the analogous voltage generating circuit 81 of FIG. 5 is replaced by a reference voltage generating circuit 81' for generating a reference voltage $V_{ref}$.

The reference voltage generating circuit 81' is constructed by a current mirror circuit 811' formed by p-channel MOS transistors Qp1, Qp2 and Qp3 connected to the power supply terminal $V_{DD}$, a current mirror circuit 812' formed by n-channel MOS transistors Qn1, Qn2 connected to the current mirror circuit 811', a resistor R1 and diodes D1 connected in series between the transistor Qn1 and the ground terminal GND, a diode D2 connected between the transistor Qn2 and the ground terminal GND, and a resistor R2 and a diode D3 connected in series between the transistor Qp3 and the ground terminal GND.

If the p-channel MOS transistors Qp1, Qp2 and Qp3 of the current mirror circuit 811' have the same size ratio W/L as each other and the n-channel MOS transistors Qp1 and Qp2 of current mirror circuit 812' have the same size ratio W/L as each other, a reference current $I_{ref}$ is represented by $$I811 = I812$$
$$= I813$$
$$= (VF2 - VF1)/r1$$
$$= I_{ref}$$

where r1 is a resistance value of the resistor R1;
VF1 is a forward voltage of the diodes D1; and
VF2 is a forward voltage of the diodes D2. Thus, the currents I811, I812 and I813 can be determined by the resistance value r1 of the resistor R1. On the other hand, the reference voltage $V_{ref}$ is represented by $$V_{ref}=VF3-r2 \cdot I_{ref}$$

where VF3 is a forward voltage of the diode D3.

Figure 8A:
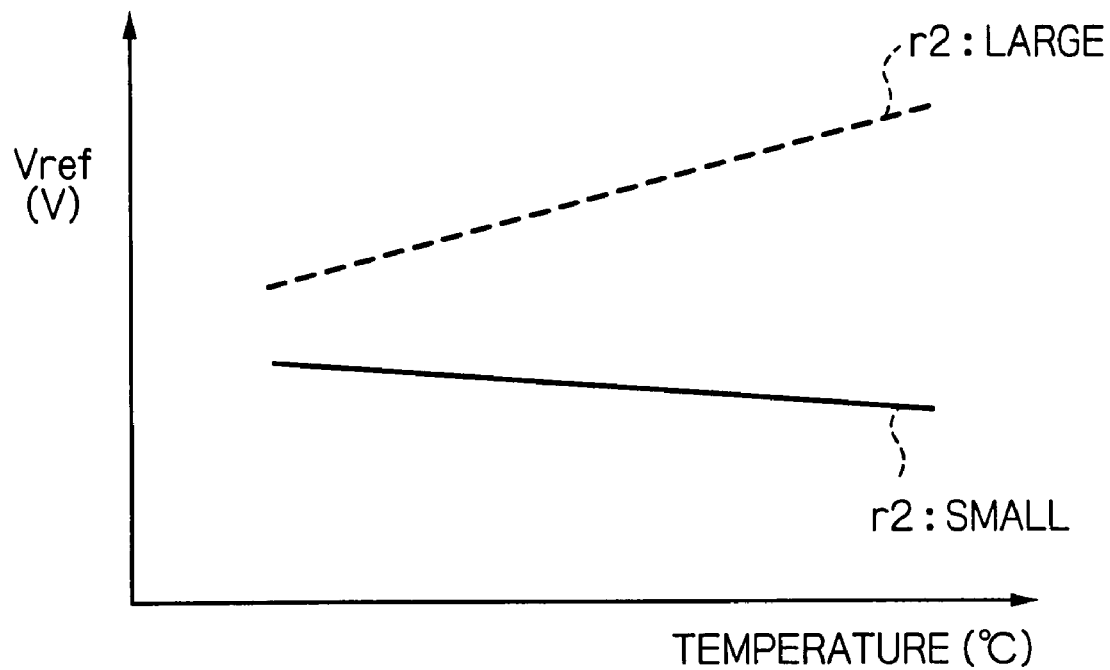
FIGS. 8A and 8B are graphs for showing the operating characteristics of the dead time control circuits of FIG. 7.

Generally, the forward voltage VF3 has a negative temperature coefficient while the resistance value r2 of the resistor R2 has a positive temperature coefficient. Therefore, the temperature coefficient of the reference voltage $V_{ref}$ is dependent upon the resistance value r2 of the resistor R2 as shown in FIG. 8A. That is, according to the present invention, the absolute value of the resistance value r2 of the resistor R2 is made small as compared with the forward voltage VF3 of the diode D3, so that the reference voltage $V_{ref}$ has a negative temperature coefficient subjected to the negative temperature coefficient of the forward voltage VF3 of the diode D3.

Figure 8B:
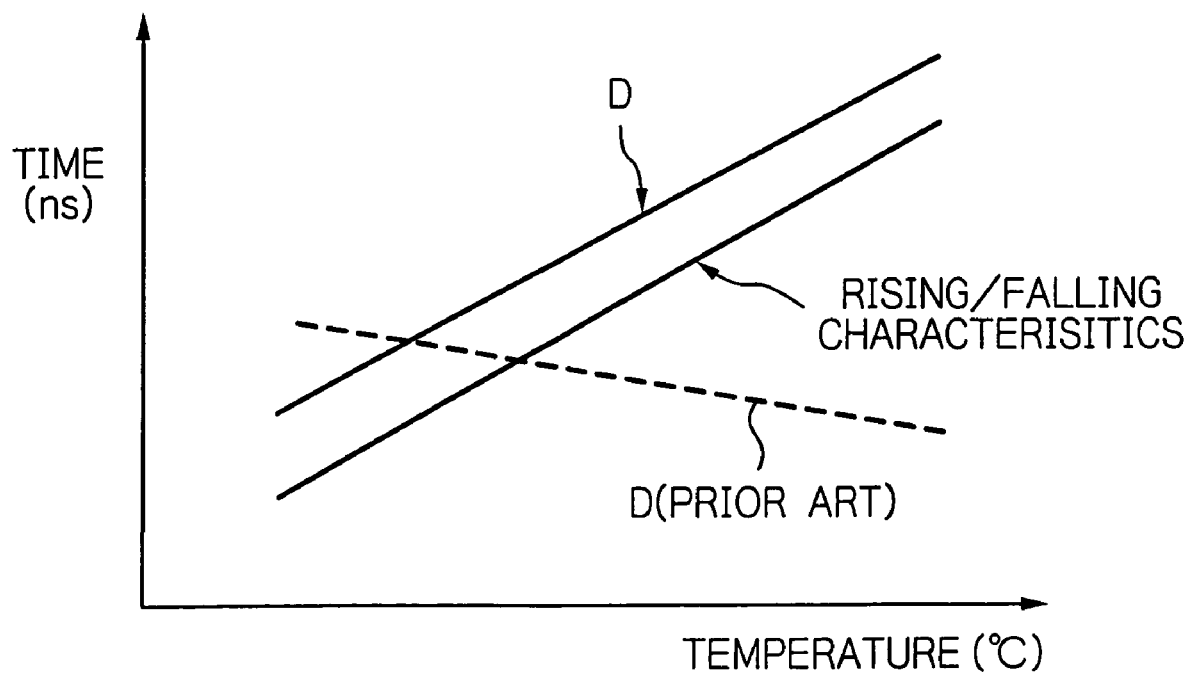

The reference voltage $V_{ref}$ is converted by the voltage-to-current converting circuit 82 into a current I82 depending upon a ratio of the reference voltage $V_{ref}$ to the resistance value of the resistor 822. Since I82=I83=I84, the current flowing through the CMOS inverter H2 is controlled by the current I84, so that the current flowing through the CMOS inverter H2 has a negative temperature coefficient. Therefore, as the temperature increases, the current flowing through the CMOS inverter H2 decreases so as to increase the delay time. Simultaneously, as the temperature increases, the current flowing through the CMOS inverter H1 decreases so as to increase the delay time. Therefore, as the temperature increases, both the delay times of the CMOS inverters H1 and H2 are increased so that the dead time D is increased as shown in FIG. 8B which shows that the dead time D has a positive temperature coefficient.

Thus, the temperature characteristics of the reference voltage $V_{ref}$ and the dead time D in dependence upon the resistance value r2 of the resistor R2 are shown in FIG. 9.

Figure 10:
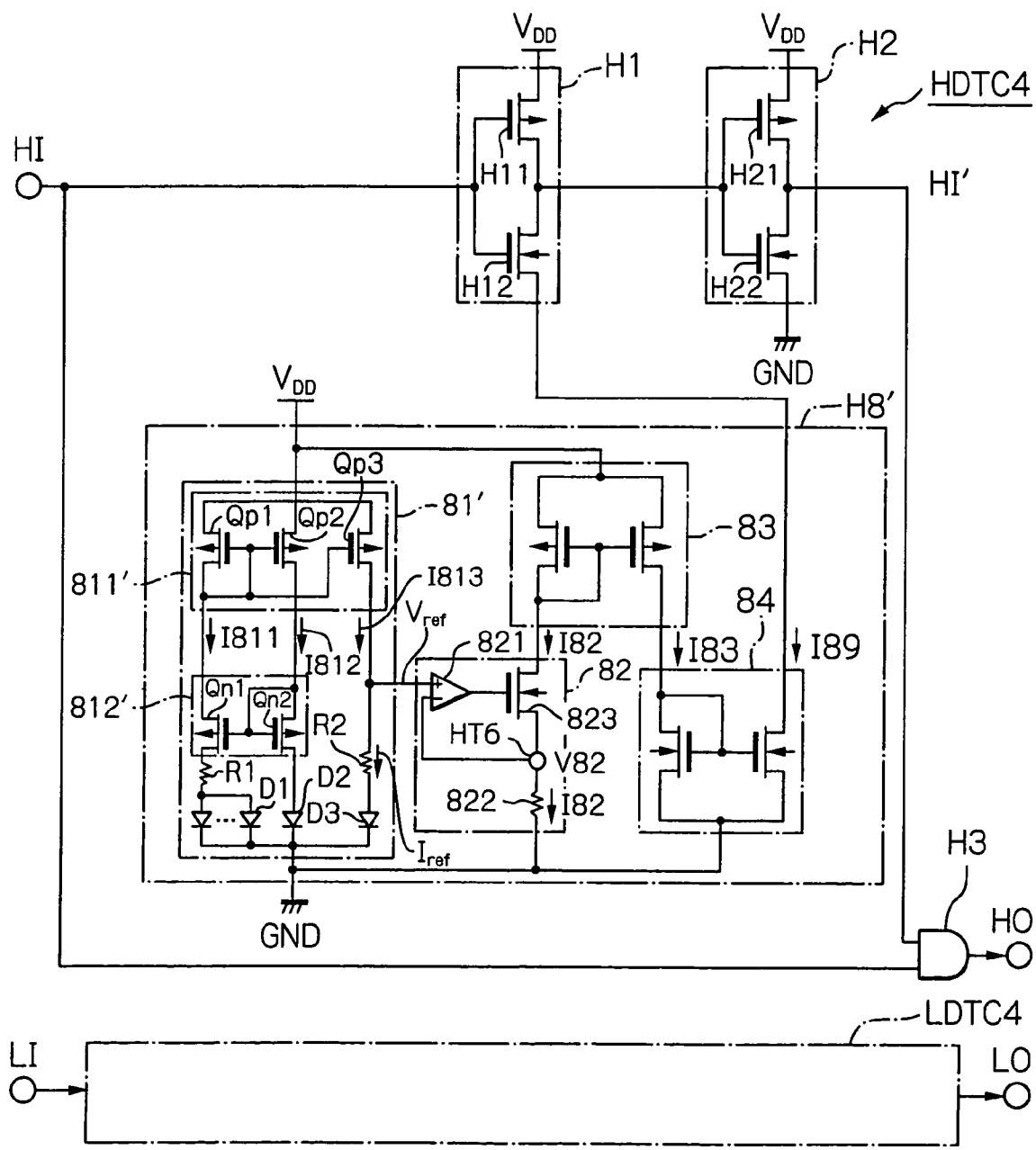
FIG. 10 is a circuit diagram illustrating a first modification of the dead time control circuits of FIG. 7.

In FIG. 10, which illustrates a first modification of the dead time control circuits of FIG. 7, the constant current source H8' of FIG. 7 is connected to the source of the MOS transistor H12 of FIG. 7. The operation of the dead time control circuits of FIG. 10 is similar to that of the dead time control circuits of FIG. 7, so that the temperature characteristics of the reference voltage $V_{ref}$ and the dead time D in dependence upon the resistance value r2 of the resistor R2 are shown in FIGS. 8A, 8B and 9.

Figure 11:
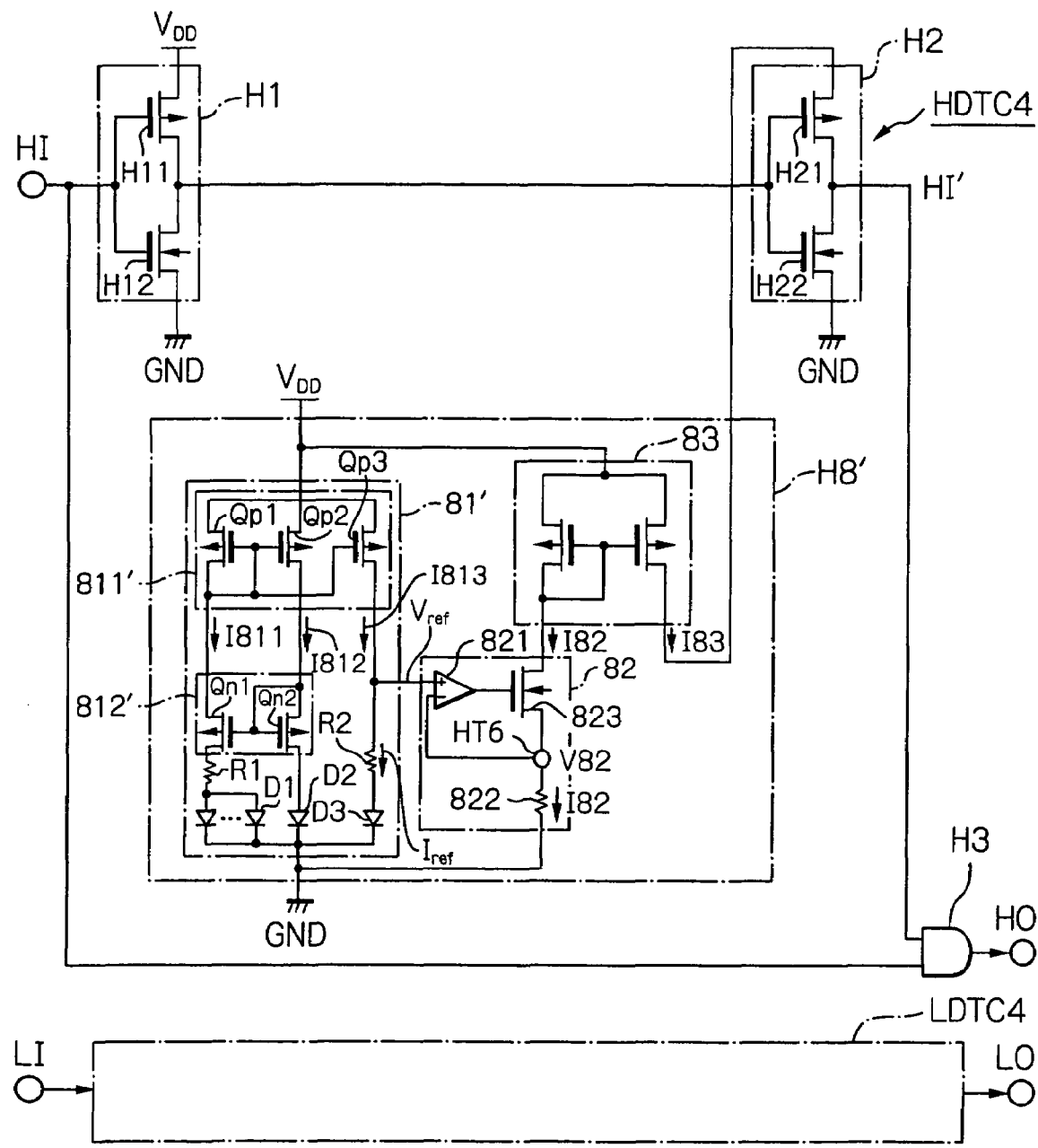
FIG. 11 is a circuit diagram illustrating a second modification of the dead time control circuits of FIG. 7.

In FIG. 11, which illustrates a second modification of the dead time control circuits of FIG. 7, the constant current source H8' of FIG. 7 is replaced by a constant current source H8'' where the current mirror circuit 84 of the constant current source H8' of FIG. 7 is deleted and the output of the current mirror circuit 83 of FIG. 7 is connected directly to the source of the MOS transistor H21 of the CMOS inverter H2 of FIG. 7. Also, the operation of the dead time control circuits of FIG. 11 is similar to that of the dead time control circuits of FIG. 7, so that the temperature characteristics of the reference voltage $V_{ref}$ and the dead time D in dependence upon the resistance value r2 of the resistor R2 are shown in FIGS. 8A, 8B and 9. Thus, the constant current source H8'' can be decreased in size and manufacturing cost as compared with the constant current source H8' of FIG. 7.

In FIG. 11, note that the constant current source H8'' can be connected to the source of the MOS transistor H11 of the CMOS inverter Hi in the same way as the constant current source H8' in FIG. 10.

Figure 12:
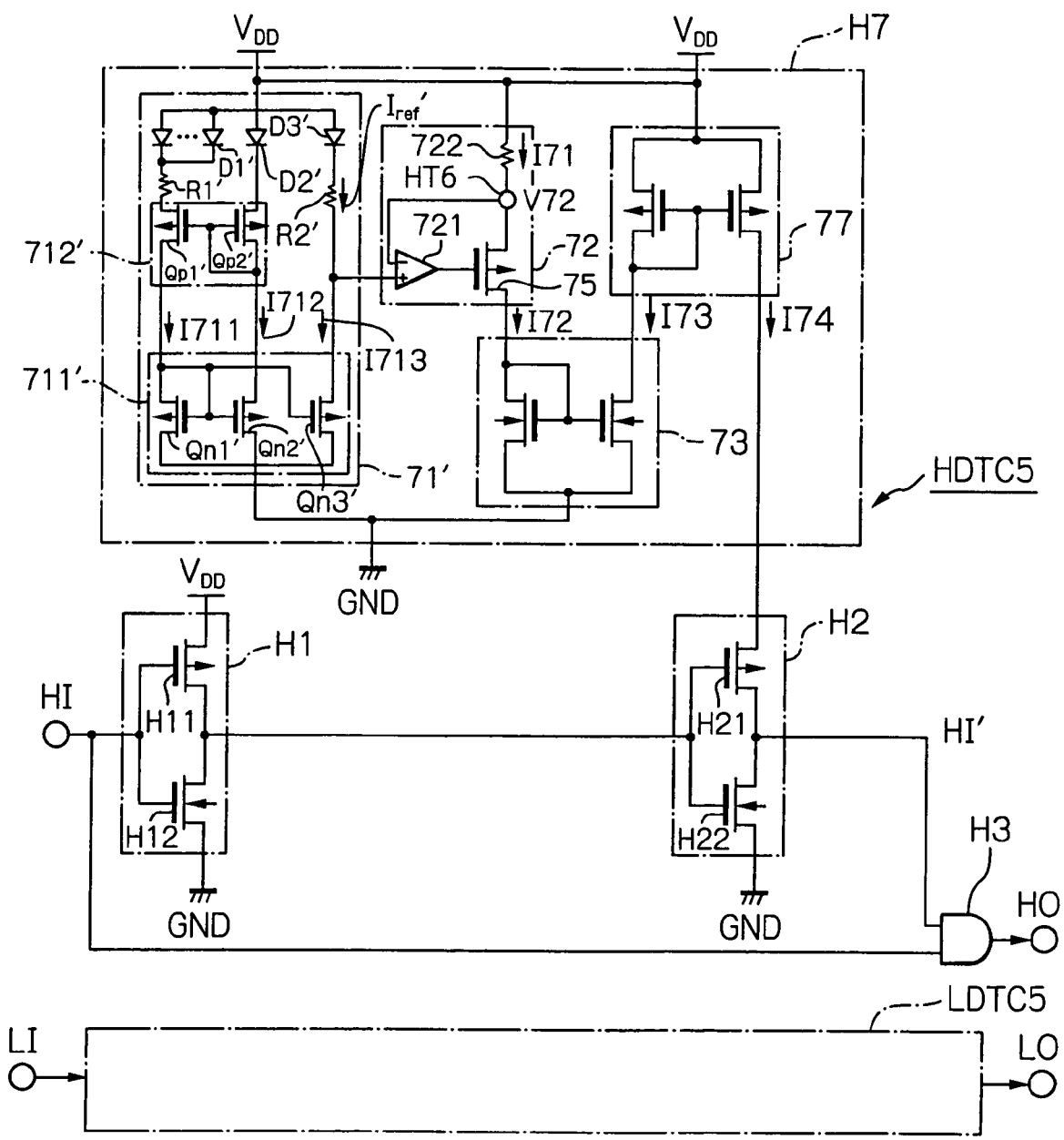
FIG. 12 is a circuit diagram illustrating a high-side dead time control circuit and a low-side dead time control circuit each as a second embodiment of the dead time control circuit according to the present invention.
Figure 13:
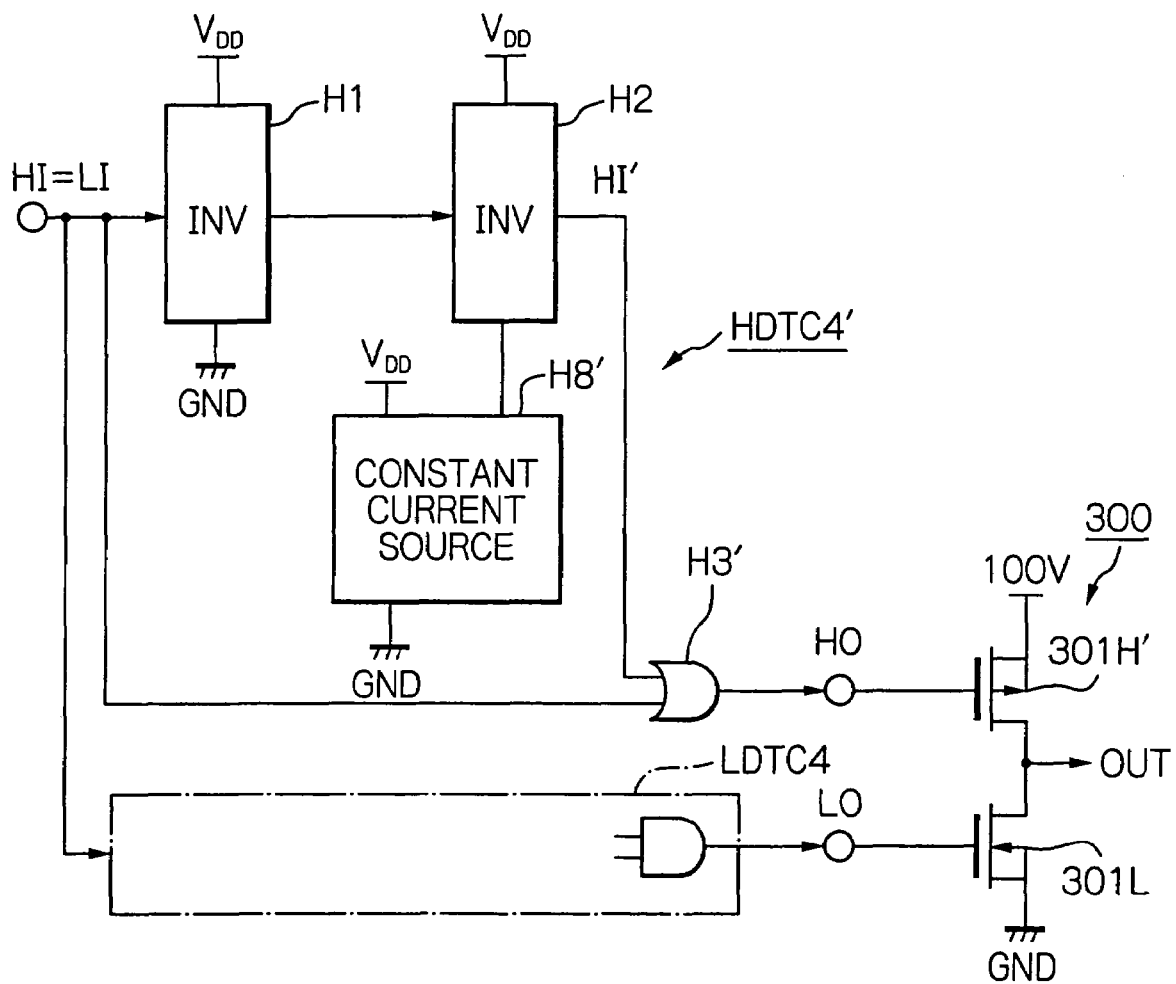
FIGS. 13, 14, 15 and 16 are circuit diagrams illustrating modifications of the dead time control circuits of FIGS. 7, 10, 11 and 12, respectively.
Figure 14:
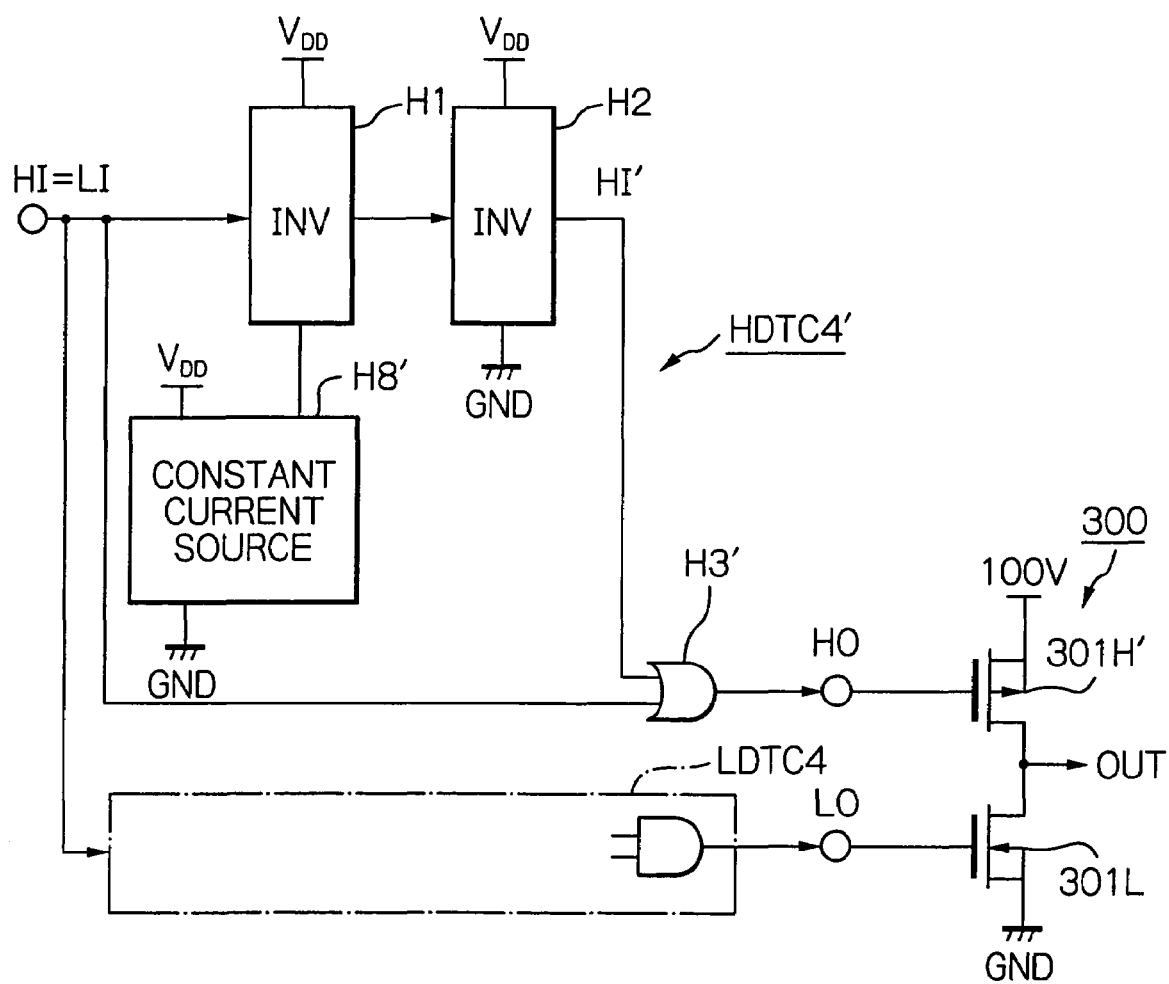
Figure 15:
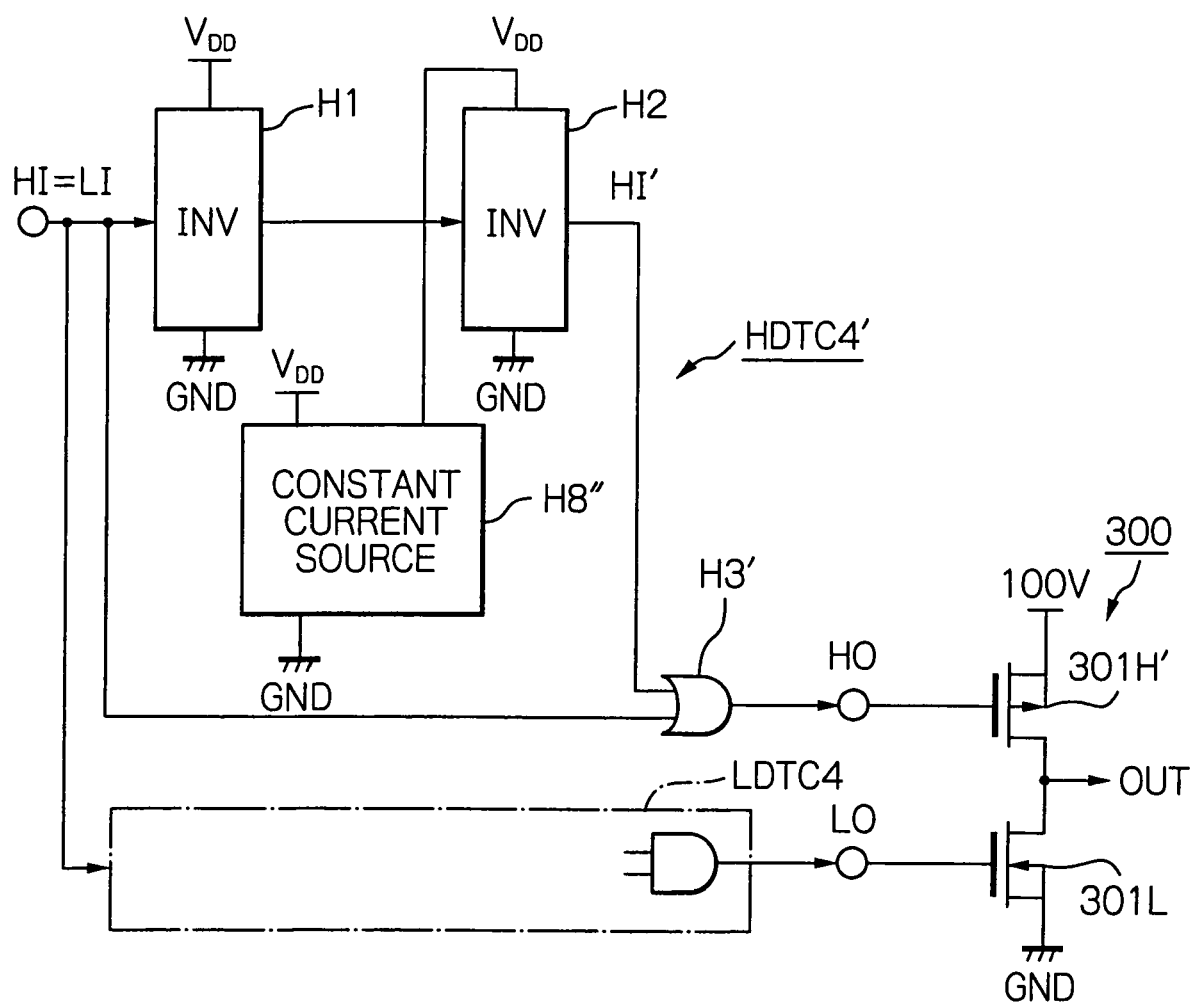
Figure 16:
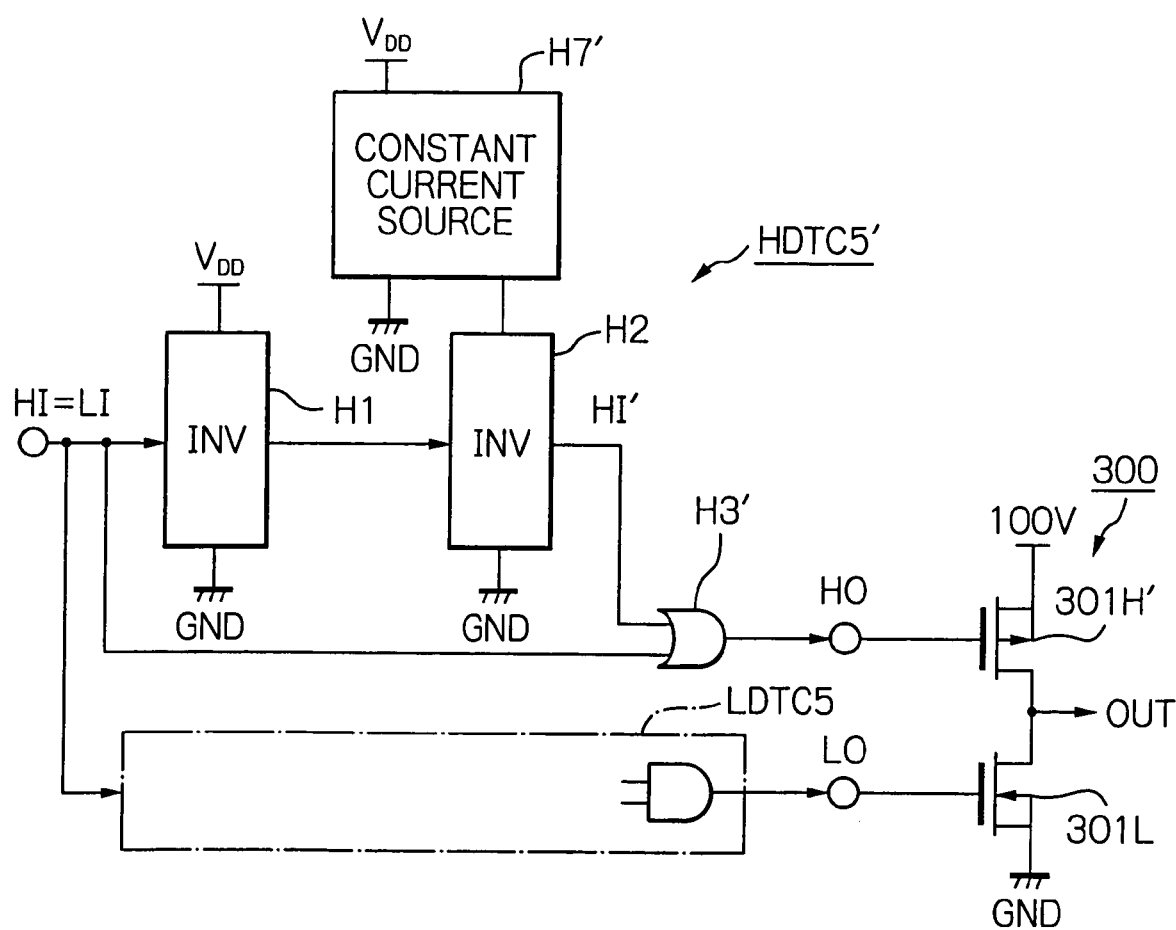

In FIG. 12, which illustrates a high-side dead time control circuit HDTC5 and a low-side dead time control circuit LDTC5 each as a first embodiment of the present invention, only the high-side dead time control circuit HDTC5 is illustrated in detail, since the low-side dead time control circuit LDTC5 has all the same structure as the high-side dead time control circuit HDTC5.

In FIG. 12, the external capacitor H5 connected to the external terminal HT3, the external capacitor H6 connected to the external terminal HT4 and the constant current source H7 of FIG. 5 are deleted, and the constant current source H7 of FIG. 5 is modified to a constant current source H7' where the analogous voltage generating circuit 71 of FIG. 5 is replaced by a reference voltage generating circuit 71' for generating a reference voltage $V_{ref}'$.

The reference voltage generating circuit 71' is constructed by a current mirror circuit 711' formed by n-channel MOS transistors Qn1', Qn2' and Qn3' connected to the ground terminal GND, a current mirror circuit 712' formed by p-channel MOS transistors Qp1', Qp2' connected to the current mirror circuit 711', a resistor R1' and diodes D1' connected in series between the transistor Qp1' and the power supply terminal $V_{DD}$, a diode D2' connected between the transistor Qp2' and the power supply terminal $V_{DD}$, and a resistor R2' and a diode D3' connected in series between the transistor Qn3' and the power supply terminal $V_{DD}$.

If the n-channel MOS transistors Qn1', Qn2' and Qn3' of the current mirror circuit 711' have the same size ratio W/L as each other and the p-channel MOS transistors Qp1' and Qp2' of current mirror circuit 712' have the same size ratio W/L as each other, a reference current $I_{ref}'$ is represented by $$I711 = I712$$
$$= I713$$
$$= (VF2' - VF1')/r1'$$
$$= I_{ref}'$$

where r1' is a resistance value of the resistor R1';
VF1' is a forward voltage of the diodes D1'; and
VF2' is a forward voltage of the diodes D2'. Thus, the currents I711, I712 and I713 can be determined by the resistance value r1' of the resistor R1'. On the other hand, the reference voltage $V_{ref}'$ is represented by $$V_{ref}' = VF3' - r2 \cdot I_{ref}'$$

where VF3' is a forward voltage of the diode D3'.

Generally, the forward voltage VF3' has a negative temperature coefficient while the resistance value r2' of the resistor R2' has a positive temperature coefficient. Therefore, the temperature coefficient of the reference voltage $V_{ref}'$ is dependent upon the resistance value r2' of the resistor R2' in the same way as $V_{ref}$ in FIG. 8A. That is, according to the present invention, the absolute value of the resistance value r2' of the resistor R2' is made small as compared with the forward voltage VF3' of the diode D3', so that the reference voltage $V_{ref}'$ has a negative temperature coefficient subjected to the negative temperature coefficient of the forward voltage VF3' of the diode D3'.

The reference voltage $V_{ref}'$ is converted by the voltage-to-current converting circuit 72 into a current I72 depending upon a ratio of the reference voltage $V_{ref}'$ to the resistance value of the resistor 722. Since I72=I73=I74, the current flowing through the CMOS inverter H2 is controlled by the current I74, so that the current flowing through the CMOS inverter H2 has a negative temperature coefficient. Therefore, as the temperature increases, the current flowing through the CMOS inverter H2 decreases so as to increase the delay time. Simultaneously, as the temperature increases, the current flowing through the CMOS inverter H1 decreases so as to increase the delay time. Therefore, as the temperature increases, both the delay times of the CMOS inverters H1 and H2 are increased so that the dead time D' is increased in the same way as the dead time D in FIG. 8B which shows that the dead time D' has a positive temperature coefficient.

Thus, the temperature characteristics of the reference voltage $V_{ref}'$ and the dead time D' in dependence upon the resistance value r2' of the resistor R2' are shown in the same way as in FIG. 9.

In the above-described second embodiment as illustrated in FIG. 12, modifications similar to the modifications as illustrated in FIGS. 10 and 11 to the first embodiment as illustrated in FIG. 7 can be applied. That is, the constant current source H7' can be connected to the source of the MOS transistor H11 of the CMOS transistor H1. Also, the current mirror circuit 77 is deleted so that the output of the current mirror circuit 73 can be connected to the source of the MOS transistor H22 of the CMOS inverter H2 while the power supply terminal $V_{DD}$ can be connected directly to the source of the MOS transistor H21 of the CMOS inverter H2.

If the push-pull type output buffer 300 of FIG. 1 is of a CMOS type where the enhancement-type n-channel MOS transistor 301H is replaced by an enhancement-type p-channel MOS transistor 301H' as illustrated in FIGS. 13, 14, 15 and 16 which correspond to FIGS. 7, 10, 11 and 12, respectively, the high-side dead time control circuit HDTC4 or HDTC5 is replaced by a high-side dead time control circuit HDTC4' or HDTC5' while the low-side dead time control circuit LDTC4 or LDTC5 is unchanged under the condition that the voltage at the high-side input terminal HI is the same as that at the low-side input terminal LI. That is, in the high-side dead time control circuit HDTC4' or HDTC5' of FIGS. 13, 14, 15 and 16, the AND circuit H3 is replaced by an OR circuit H3'.

Note that the present invention can also be applied to a dead time control circuit where the number of inverters as a delay circuit can be 4, 6, . . . .

The invention claimed is:

1. A dead time control circuit comprising:
    an input terminal;
    an output terminal;
    a delay circuit connected to said input terminal and adapted to delay signals therethrough by a delay time corresponding to a dead time; and
    a logic circuit having a first input connected via said delay circuit to said input terminal, a second input connected directly to said input terminal, and an output connected to said output terminal,
    said dead time having adjustable temperature characteristics to preclude a through current in said delay circuit at high temperatures.

2. The dead time control circuit as set forth in claim 1, wherein said delay circuit comprises 2N (N=1,2, . . . ) inverters connected in series, said dead time control circuit further comprising a reference voltage generating circuit adapted to generate a reference voltage for controlling a current flowing through at least one of said inverters, said reference voltage having adjustable temperature characteristics.

3. The dead time control circuit as set forth in claim 2, wherein said reference voltage generating circuit comprises:
    first and second power supply terminals;
    a first current mirror circuit connected to said first power supply terminal and having three transistors of a first conductivity type connected in parallel;
    a second current mirror circuit connected to said first current mirror circuit and having two transistors of a second conductivity type connected to two of said transistors of said first current mirror circuit;
    a first resistor and a first diode connected in series between one of said transistors of said second current minor circuit and said second power supply terminal;
    a second diode connected between the other of said transistors of said second current minor circuit and said second power supply terminal; and
    a second resistor and a third diode connected in series between the other of said transistors of said first current mirror transistor and said second power supply terminal.

4. The dead time control circuit as set forth in claim 3, wherein a resistance value of said second resistor is smaller than a forward voltage of said third diode.

5. The dead time control circuit as set forth in claim 1, further comprising:
    a voltage-to-current converter connected to said reference voltage generating circuit and adapted to convert said reference voltage into a current; and
    at least one current minor circuit connected to said voltage-to-current converter and adapted to transmit said current to said at least one of said inverters.

6. The dead time control circuit as set forth in claim 1, wherein said logic circuit comprises an AND circuit.

7. The dead time control circuit as set forth in claim 1, wherein said logic circuit comprises an OR circuit.

8. The dead time control circuit of claim 1, wherein said adjustable temperature characteristics are adjusted so that said dead time has a positive temperature coefficient.

9. The dead time control circuit of claim 1, wherein said adjustable temperature characteristics are due to selecting a value of a resistance in said delay circuit.

10. A push-pull circuit, comprising a dead time control circuit of claim 1.

11. A dead time control circuit comprising:
    an input terminal;
    an output terminal;
    a delay circuit connected to said input terminal and adapted to delay signals therethrough by a delay time corresponding to a dead time; and
    a logic circuit having a first input connected via said delay circuit to said input terminal, a second input connected directly to said input terminal, and an output connected to said output terminal,
    said dead time having adjustable temperature characteristics,
    wherein said delay circuit comprises 2N (N=1, 2, . . . ) inverters connected in series, said dead time control circuit further comprising a reference voltage generating circuit adapted to generate a reference voltage for controlling a current flowing through at least one of said inverters, said reference voltage having adjustable temperature characteristics,
    wherein the adjustable temperature characteristics of said reference voltage have a negative temperature coefficient characteristic.

12. A dead time control circuit, comprising:
    an input terminal;
    an output terminal;
    a delay circuit connected to said input terminal and adapted to delay signals therethrough by a delay time corresponding to a dead time, said delay circuit comprising a resistance value selected to so that said dead time has a positive temperature coefficient; and
    a logic circuit having a first input connected via said delay circuit to said input terminal, a second input connected directly to said input terminal, and an output connected to said output terminal.

* * * * *